(12) United States Patent
Fuergut et al.

(10) Patent No.: US 9,593,009 B2
(45) Date of Patent: Mar. 14, 2017

(54) APPARATUS COMPRISING AND A METHOD FOR MANUFACTURING AN EMBEDDED MEMS DEVICE

(71) Applicant: Infineon Technologies AG, Neubiberg (DE)

(72) Inventors: Edward Fuergut, Dasing (DE); Horst Theuss, Wenzenbach (DE); Rainer Leuschner, Samoreau (FR)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/515,304

(22) Filed: Oct. 15, 2014

(65) Prior Publication Data

US 2015/0028436 A1    Jan. 29, 2015

Related U.S. Application Data

(62) Division of application No. 13/571,263, filed on Aug. 9, 2012, now Pat. No. 8,872,288.

(51) Int. Cl.
*B81B 7/00* (2006.01)
*H04R 19/00* (2006.01)
(Continued)

(52) U.S. Cl.
CPC .......... *B81B 7/0041* (2013.01); *B81B 3/0021* (2013.01); *B81C 1/00253* (2013.01); *H01L 24/19* (2013.01); *H01L 24/96* (2013.01); *H04R 19/005* (2013.01); *H04R 31/006* (2013.01); *B81B 2201/0257* (2013.01); *B81B 2201/0264* (2013.01); *B81B 2203/0127* (2013.01); *H01L 2224/04105* (2013.01); *H01L 2224/12105* (2013.01); *H01L 2224/24137* (2013.01); *H01L 2924/12042* (2013.01); *H01L 2924/1301* (2013.01); *H01L 2924/1305* (2013.01);
(Continued)

(58) Field of Classification Search
CPC ........................... B81B 7/0041; B81B 3/0021
See application file for complete search history.

(56) References Cited

U.S. PATENT DOCUMENTS 7,657,025 B2    2/2010   Hsu et al.
7,790,492 B1 *  9/2010   Baumhauer, Jr. ..... B81C 1/0023
                                                    257/E23.133
(Continued)

FOREIGN PATENT DOCUMENTS

CN     101132654 A    2/2008
CN     101249936 A    8/2008
(Continued)

*Primary Examiner* — Tran Tran
(74) *Attorney, Agent, or Firm* — Slater Matsil, LLP

(57) ABSTRACT

A system and a method for forming a packaged MEMS device are disclosed. In one embodiment a packaged MEMS device includes a MEMS device having a first main surface with a first area along a first direction and a second direction, a membrane disposed on the first main surface of the MEMS device and a backplate adjacent to the membrane. The packaged MEMS device further includes an encapsulation material that encapsulates the MEMS device and that defines a back volume, the back volume having a second area along the first direction and the second direction, wherein the first area is smaller than the second area.

23 Claims, 11 Drawing Sheets

(51) Int. Cl.
  *H04R 31/00*  (2006.01)
  *B81C 1/00*  (2006.01)
  *B81B 3/00*  (2006.01)
  *H01L 23/00*  (2006.01)

(52) U.S. Cl.
  CPC .............. *H01L 2924/13055* (2013.01); *H01L 2924/13091* (2013.01); *H01L 2924/1461* (2013.01); *H01L 2924/181* (2013.01); *H04R 2201/003* (2013.01)

(56) References Cited

U.S. PATENT DOCUMENTS

| | | | |
|---|---|---|---|
| 7,933,428 | B2 | 4/2011 | Sawada |
| 8,018,049 | B2 | 9/2011 | Minervini |
| 8,103,025 | B2 | 1/2012 | Mullenborn et al. |
| 8,186,845 | B2 | 5/2012 | Zheng |
| 9,029,962 | B1* | 5/2015 | Dreiza .................... H01L 27/04 257/416 |
| 2007/0205499 | A1 | 9/2007 | Wang et al. |
| 2008/0037768 | A1 | 2/2008 | Hsu et al. |
| 2008/0083957 | A1* | 4/2008 | Wei ....................... B81B 7/0064 257/415 |
| 2008/0287813 | A1 | 11/2008 | Kirstein et al. |
| 2008/0298621 | A1 | 12/2008 | Theuss et al. |
| 2008/0310663 | A1* | 12/2008 | Shirasaka et al. ............ 381/355 |
| 2009/0129622 | A1 | 5/2009 | Chen et al. |
| 2010/0303273 | A1 | 12/2010 | Sawada |
| 2011/0198714 | A1 | 8/2011 | Yang |
| 2011/0280419 | A1 | 11/2011 | Kasai |
| 2012/0250925 | A1* | 10/2012 | Lillelund ...................... 381/355 |

FOREIGN PATENT DOCUMENTS

| | | |
|---|---|---|
| CN | 101325820 A | 12/2008 |
| CN | 101729966 A | 6/2010 |
| CN | 102244827 A | 11/2011 |
| CN | 102336390 A | 2/2012 |

* cited by examiner

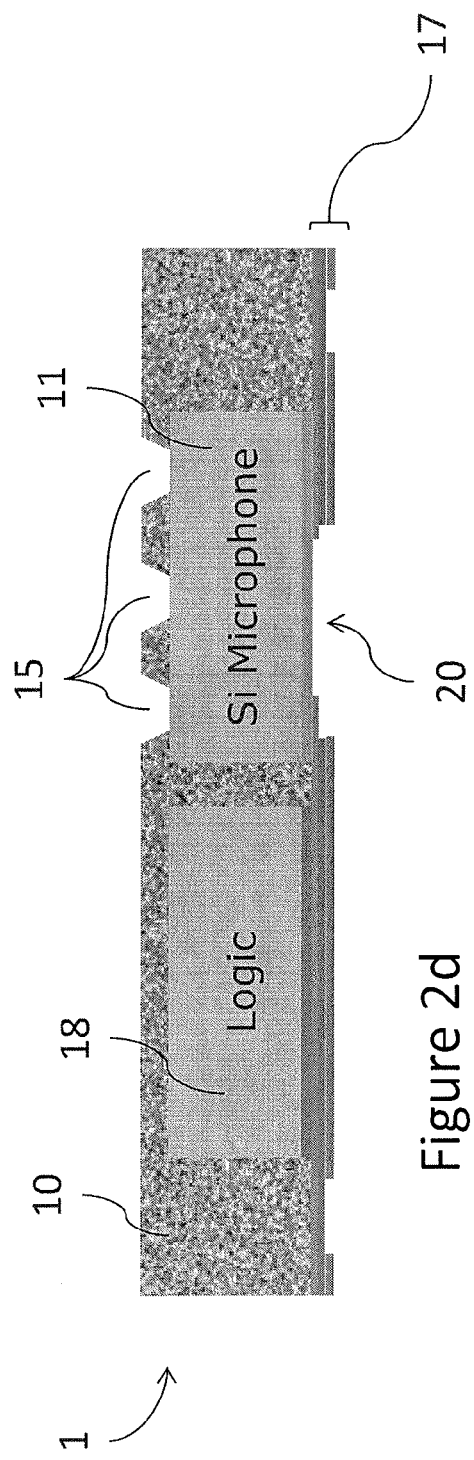
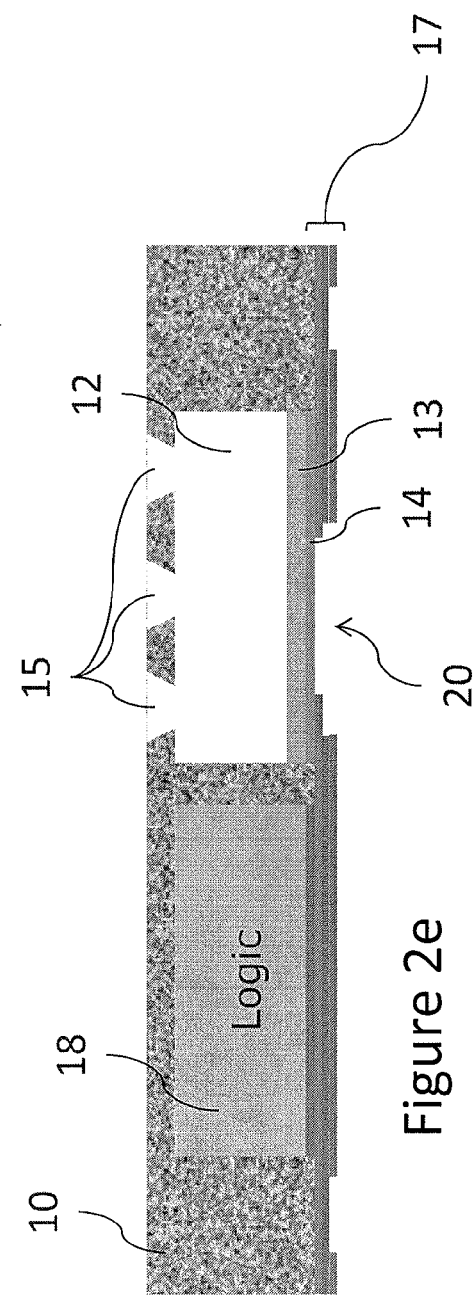
Figure 2d
Figure 2e

US 9,593,009 B2

APPARATUS COMPRISING AND A METHOD FOR MANUFACTURING AN EMBEDDED MEMS DEVICE

This is a divisional application of U.S. application Ser. No. 13/571,263, entitled "Apparatus Comprising and a Method for Manufacturing an Embedded MEMS Device" which was filed on Aug. 9, 2012 and is incorporated herein by reference.

TECHNICAL FIELD

The present invention relates generally to a system and a method for manufacturing a micro-electromechanical system (MEMS) package, and, in particular embodiments, to a system and a method for manufacturing a MEMS microphone package.

BACKGROUND

Over the past years a desire for smaller electronic form factors and power consumption along with increased performance has driven an integration of device components. One area where integration took place is area of MEMS devices. More specifically, microphones in electronic devices such as, e.g., cell phones, laptops, and tablets are predominately MEMS microphones.

A feature in the performance of a MEMS microphone is the size of the back volume. The back volume provides a reference pressure against incident sound waves. Typically, the back volume is defined by the substrate of the silicon microphone.

SUMMARY OF THE INVENTION

These and other problems are generally solved or circumvented, and technical advantages are generally achieved, by embodiments of the present invention which disclose a MEMS structure with an extended back volume and a method of manufacture of a MEMS microphone.

In accordance with an embodiment of the present invention a packaged MEMS device a MEMS device comprises a MEMS device having a first main surface with a first area along a first direction and a second direction, a membrane disposed on the first main surface of the MEMS device and a backplate adjacent to the membrane. The packaged MEMS device further includes an encapsulation material that encapsulates the MEMS device and that defines a back volume, the back volume having a second area along the first direction and the second direction, wherein the first area is smaller than the second area.

In accordance with an embodiment of the present invention a device comprises a component, a transducer disposed adjacent to the component, and a transducer opening next to the transducer. The device further comprises an encapsulation material encapsulating the component, the transducer and a portion of the transducer opening, and a lid disposed on the encapsulation material sealing the transducer opening.

In accordance with another embodiment of the present invention, a method for making a device comprises encapsulating a transducer in an encapsulation material, the transducer comprising a substrate and after encapsulating the transducer in the encapsulation material, etching the substrate of the transducer forming a transducer opening.

In accordance with another embodiment of the present invention, a method for manufacturing an integrated device comprises forming a reconstitution wafer comprising an encapsulation material, the reconstitution wafer comprising a MEMS device and a component encapsulated in the encapsulation material and forming a redistribution layer (RDL) on a first main surface of the reconstitution wafer, the RDL electrically connecting the MEMS device and the component. The method further comprises exposing a substrate of the MEMS device from a second main surface of the reconstitution wafer, etching the substrate of the MEMS device forming an opening, forming a material layer on the second main surface of the reconstitution wafer and singulating the reconstitution wafer thereby forming the integrated device.

BRIEF DESCRIPTION OF THE DRAWINGS

For a more complete understanding of embodiments of the present invention, and the advantages thereof, reference is now made to the following descriptions taken in conjunction with the accompanying drawings, in which:

FIGS. 2b-2f show different stages of the manufacturing process;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an embedded MEMS microphone manufactured in a chip embedding 0 process. Embodiments of the invention may also be applied, however, to other MEMS devices, sensors or transducers and to other packaging processes.

A problem with conventional MEMS microphone is that the back-volume of the microphone is limited.

Embodiments of the invention provide an increased back-volume for MEMS microphones. Embodiments of the invention provide a back volume which is defined by an encapsulation material. Further embodiments of the invention provide a manufacturing process wherein the back volume is formed or created after the MEMS microphone is encapsulated.

An advantage of embodiments of the invention is an improved manufacturing process comprising: easy integration of other components in encapsulation material and easy handling of the MEMS microphone because of the unreleased membrane.

A further advantage of the embodiment of the invention is that a larger back volume is typically more beneficial than a smaller back volume.

A final advantage of embodiments of the invention is an increased back volume of a MEMS microphone while the expensive membrane is not increased.

Application areas for the MEMS microphone may be head-sets, hearing aids or loudspeakers.

Figure 1:
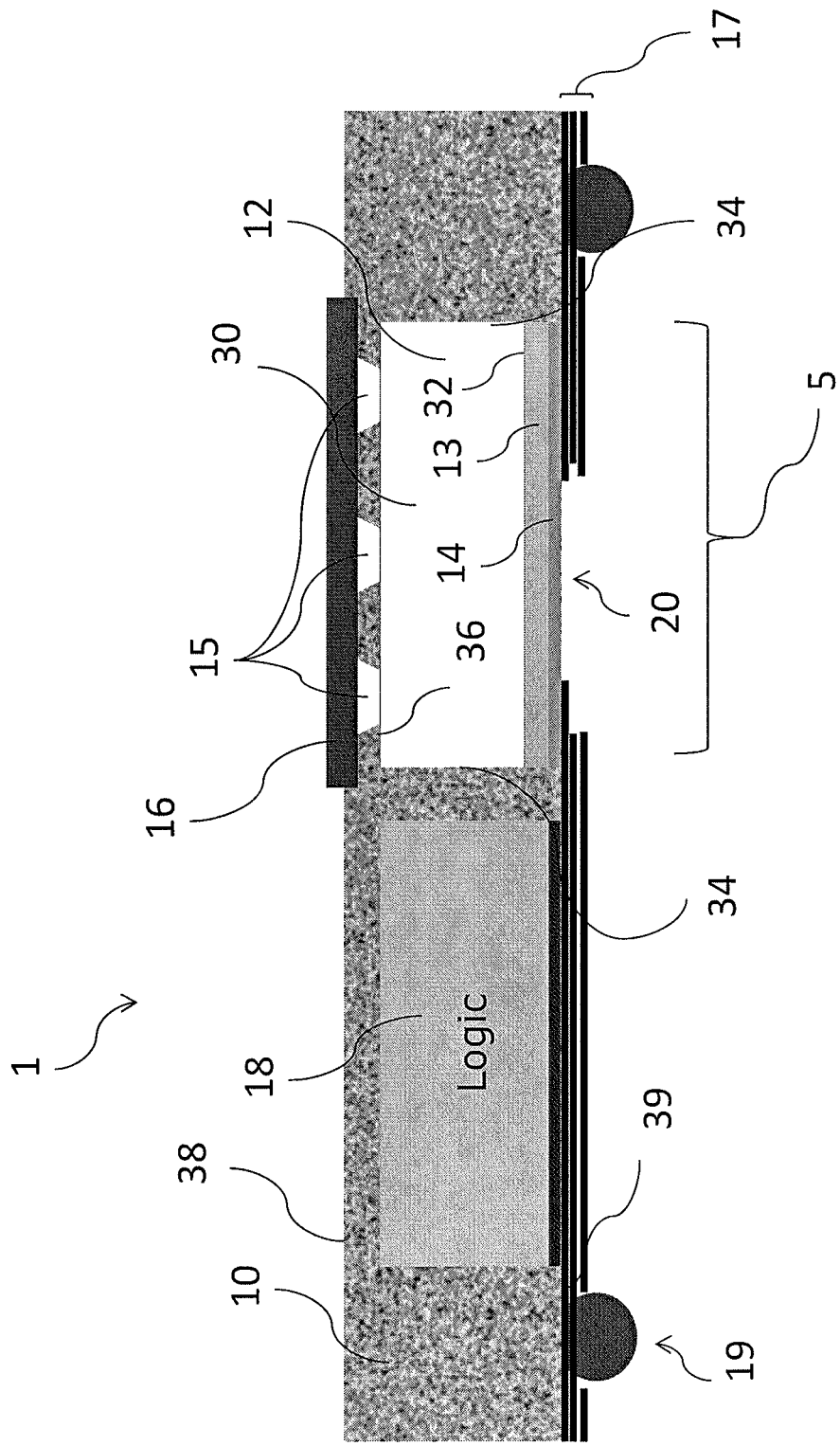
FIG. 1 shows a cross-sectional view of an embodiment of an integrated component.

FIG. 1 illustrates an integrated component 1 comprising a transducer 5 and a component 18 encapsulated in an encapsulation material 10. The transducer 5 may be a MEMS microphone such as a silicon microphone. Alternatively, the transducer 5 may be a sensor such as a pressure sensor, an accelerometer, or a RF MEMS.

In one embodiment the transducer 5 may comprise a MEMS device having a membrane 14 and a backplate 13 disposed adjacent to the membrane 14. The membrane 14 is separated from the backplate 13 by a small gap (e.g., air) distance, typically between about 1 µm and about 3 µm. In other embodiments the gap distance may be less than about 1 µm or greater than about 3 µm. The membrane/backplate 13, 14 separate a back volume 12 from an external acoustic environment which the transducer 5 is configured to sense.

Incident acoustic signals have access to the membrane 14 through a sound port 20. As known to one skilled in the art, incident acoustic signals comprise sound waves causing oscillations in air pressure. Sound waves cause the membrane 14 to experience a deflection. The deflection is a change in gap distance, which is measured through a change in capacitance across the membrane 14 and the backplate 13. The back volume 12 provides a reference volume.

The integrated component 1 further comprises the component 18. In one embodiment the component 18 may comprise a discrete device such as a single semiconductor device or an integrated circuit (IC). For example, the component 18 may comprise a pre-amplifier and input/output terminals. Alternatively, the component 18 comprises a protection device or a power semiconductor device integrated with the pre-amplifier.

The component 18 may comprise a semiconductor device such as a MOSFET or a power semiconductor device such as a bipolar transistor, an insulated gate bipolar transistor (IGBT), a power MOSFET, a thyristor or a diode. Alternatively, the component 18 may comprise a resistor, a protective device, a capacitor, a sensor or a detector, for example. The component 18 may be a system on chip (SoC).

Moreover, the integrated component 1 comprises an encapsulation material 10. The encapsulation material 10 may comprise a polyimide, an epoxy resin, a thermoplastic, a ceramic, a metal ceramic, or a metal plastic. The encapsulation material may be an epoxy with a thermal conductive filler material. For example, the filler content is at least about 70% to about 93% of silicon oxide, aluminum oxide, boron nitride, or zinc oxide. Alternatively, the encapsulation material 10 may comprises silicon heavily filled with a filler material.

The encapsulation material 10 comprises a transducer opening or MEMS opening 30. The transducer opening or MEMS opening 30 may define a back volume 12 of a MEMS microphone 5. The transducer opening 30 comprises a bottom surface 32, sidewalls 34 and a top surface 36. In one embodiment the area of the top surface 36 comprises the same as the bottom surface 32. In one embodiment the area of the bottom surface 32 is the same as the area of the top surface of the backplate 13. The sidewalls 34 are vertical. In alternative embodiments, the sidewalls are tempered and the area of the top surface 36 is different than the area of the bottom surface 32.

The encapsulation material may comprise etch holes 15 in a second main surface 38 of the encapsulation material 10.

The etch holes 15 may be sealed with a material layer, cap, or lid 16. The lid 16 may be a conductive material or an insulating material. For example, the lid 16 may be a metal, a photoresist, a laminate, or a combination thereof. Alternatively the lid 16 comprises other materials suitable for sealing the transducer opening 30.

In one embodiment the transducer 5 and the component 18 are integrated in one single component or chip.

The integrated sensor component 1 further comprises a redistribution layer (RDL) 17. The RDL 17 is disposed on a first main surface 39 of the integrated component 1. The RDL 17 is disposed outside the component 18 and the transducer 5. The RDL 17 may comprise metal traces or metal interconnects embedded in an insulating layer. The metal traces connect the component 18 with the transducer 5. The metal traces further connect the component 18 and/or transducer 5 with contact pads disposed in the RDL 17. The insulating material of the RDL 17 may comprise polyimide, silicon nitride or silicon oxide or a combination thereof. The conductive traces and the bond pads may comprise Cu or Al.

The integrated component 1 is configured to be bonded to a component carrier such as substrate or printed circuit board. Interconnects such as solder balls or wires may be placed on or bonded to the bonding pads of the RDL in order to bond the integrated component 1 to the component carrier.

Figure 2A:
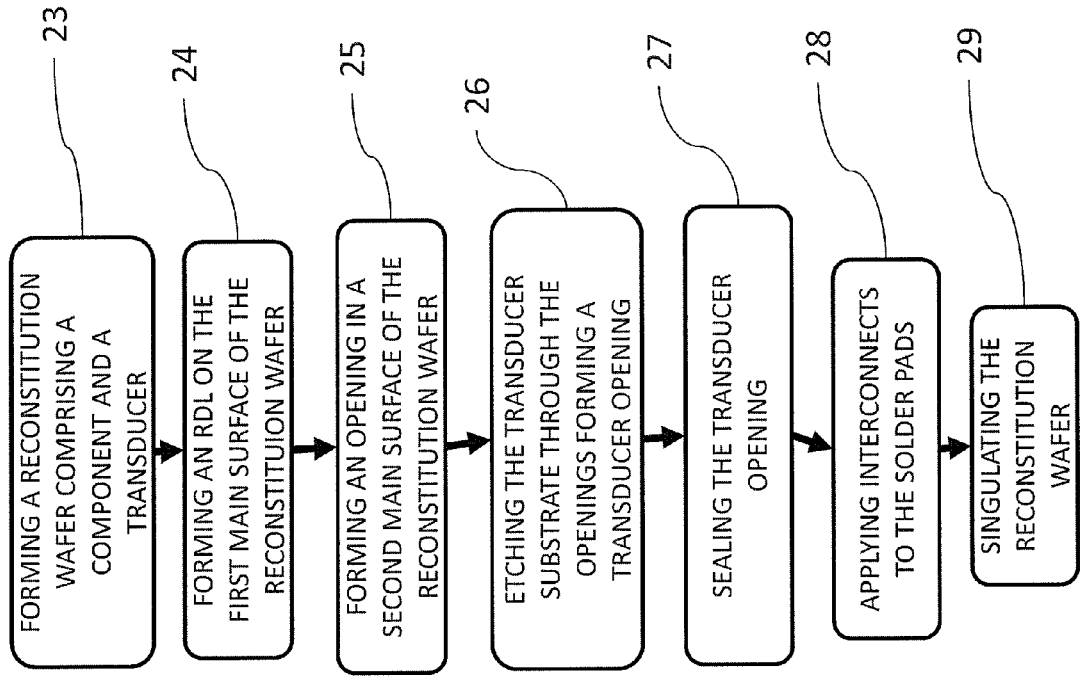
FIG. 2a shows a flow chart of an embodiment of a manufacturing process.

FIG. 2a shows a flow chart of an embodiment of a manufacturing process. In a first step 23 a reconstitution (or reconstituted) wafer is formed. The reconstitution wafer may be formed by applying a chip embedding process. The chip embedding process is a fan-out wafer level packaging WLP type technique which allows manufacturing components not limited by the chip size. The chip embedding process may comprise an embedded wafer level process or embedded wafer level ball grid array (eWLB).

The package is not realized on a silicon wafer, as with traditional WLP processing, but from an artificial wafer shaped carrier. Diced components from a wafer such as a silicon wafer are transitioned to an artificial or reconstitution carrier during the initial stages of the chip embedding process. Moreover, diced transducers such as MEMS microphones from a transducer wafer or MEMS wafer are also transitioned to the reconstitution wafer and placed next to the diced components.

For example, known good dies (e.g., components and transducer) from a silicon wafer are picked and placed on a wafer-shaped carrier covered with an adhesive foil. The dies are oriented with their active side facing the carrier surface. The designed size of the singulated device including the component and the transducer determines the size of fan-out areas around the component and the transducer. The gaps between the placed dies are filled with an encapsulation material (e.g., a polyimide, an epoxy resin, a thermoplastic, a ceramic, a metal ceramic, or a metal plastic).

Figure 2B:
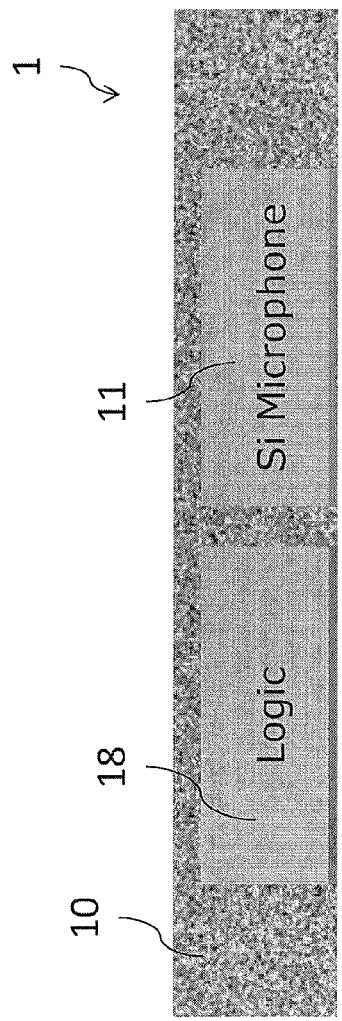

The reconstitution wafer comprises a plurality of integrated components. FIG. 2b shows one integrated component 1 comprising a transducer and a component. In another embodiment a single integrated component may comprise a component and a plurality of transducers, a transducers and a plurality of components or a plurality of components and a plurality of transducers such as two components and two transducers. The embodiment of FIG. 2b shows an integrated component 1 comprising a component 18, a silicon MEMS microphone 11 and an encapsulation material 10. The component 18, the MEMS microphone 11 and the encapsulation material 10 are described with respect to FIG. 1.

Figure 2C:
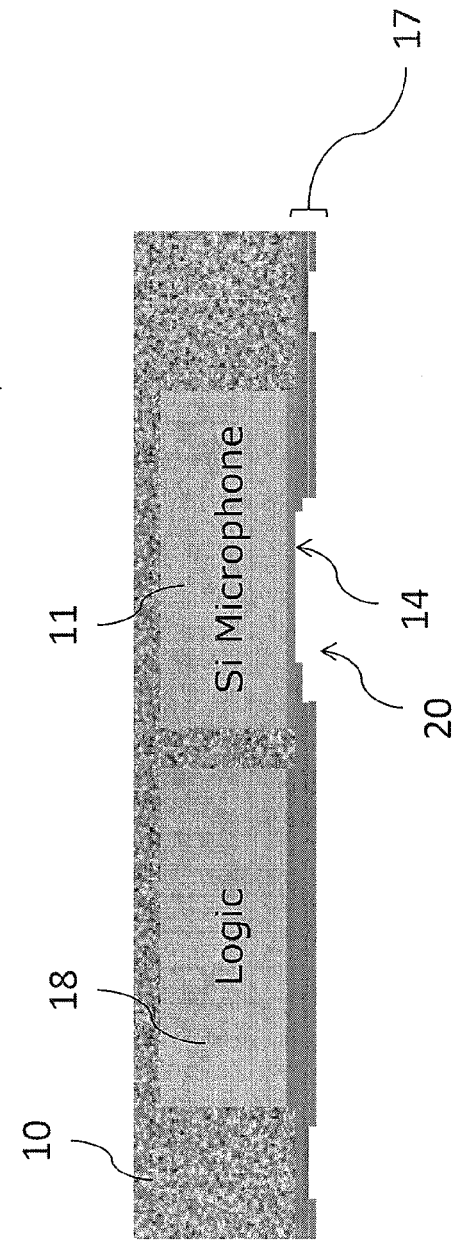

In step 24 a RDL is formed on a first main surface of the reconstitution wafer. The RDL may be formed by depositing a first insulating material or a dielectric material, structuring the insulating material, sputtering a seed layer on the structured insulating material, electroplating or otherwise depositing the redistribution lines and landing pads, and depositing a second insulating material or dielectric material. In one embodiment only the first dielectric material or the second dielectric material may be deposited. FIG. 2c shows integrated component 1 after depositing of the RDL 17. FIG. 2c shows a sound port 20 adjacent to the membrane 14. The sound port 20 may be formed by an opening of the RDL 17 next to the membrane 14. The area of the sound port 20 closest to the membrane may be the same as the membrane 14. Alternatively, the area of the sound port 20 is larger or smaller than the area of the membrane 14. In one embodiment the RDL 17 comprises an RDL layer stack comprising two or more RDLs disposed on each other.

In step 25 the reconstitution wafer is flipped and etch holes or etch vias are formed in a second main surface of the reconstitution wafer. The holes or openings are formed so that they expose at least a portion of the back surface of the transducer. In one embodiment the openings or holes are formed by structuring a photoresist disposed on the second main surface of the reconstitution wafer and then etching the encapsulation material. Small vias may be formed in the encapsulation material all the way down to the back surface of the transducer. The vias are large enough that the subsequently etched silicon can be removed through the vias. The vias may be formed by applying etch chemistries comprising CHOLIN, HF, $H_2SO_4$, $HNO_3$ or combinations thereof. FIG. 2d shows the integrated sensor component 1 having small etch holes 15 in the encapsulation material 10. The small etch holes 15 may only be disposed over the MEMS microphone 11.

In one embodiment the holes or vias are formed by a laser drilling process. For example, a 355 nm ultraviolet laser may drill vias or holes in the encapsulation material.

In one embodiment the openings are formed by grinding. The reconstitution wafer may be grinded from the second main surface exposing the back side of the transducer. For example, the second main surface of the reconstitution wafer may be grinded if the back side of the transducer is closer to the second main surface of the reconstitution wafer than back side of the component (e.g., the component is smaller in height than the transducer).

In step 26 the transducer is etched through the holes or vias. In particular, the substrate of the transducer is etched applying an anisotropic etch (e.g., a wet etch) or an isotropic etch (e.g., a dry etch). The etching chemistry may not etch the component because the encapsulation material protects the component from being etched. The etching chemistry may remove the substrate of the transducer down to the active device (e.g., membrane/backplate). The etching chemistry may remove the substrate such that the horizontal dimensions of the transducer opening (e.g., back volume) are formed by the sidewalls of the encapsulation material. In one embodiment the etching chemistry may selectively etch the substrate such that a portion of the substrate forms the sidewalls of the transducer opening (e.g., back volume). In one embodiment the transducer opening (e.g., back volume) is formed by a first etching the transducer substrate forming an opening (e.g., isotropic etch) and then by extending the opening (e.g., anisotropic etch) into the encapsulation material.

The etch is performed with etchants such as, e.g., $HNO_3$ and HF, KOH, $SF_6$ or other etchants. The resulting transducer comprises only the active area such as a membrane and a backplate separated by a small gap distance. In one embodiment where the transducer comprises a semiconductor material other than silicon, other etch chemistries are applied.

In one embodiment the backplate is protected by an etch stop layer. The etch stop layer may be a conductive material such as a metal or an insulating material such as a polymer, an oxide or a nitride.

FIG. 2e shows the integrated component 1 after the MEMS opening 12 (e.g., back volume) is formed through the holes or vias 15. The integrated component 1 comprises a MEMS opening 12 replacing the microphone substrate 11.

In step 27 the transducer opening (e.g., back volume) is sealed. The MEMS opening is sealed with a lid. The lid may be deposited on the entire second main surface of the reconstitution wafer or selectively formed on the second main surface of the reconstitution wafer. Alternatively, the lid is formed in a blanket deposition and then removed so that the lid remains on the openings. The lid may comprise a photoresist, a laminate or a solid structure such as a metal or a plastic. The lid may be disposed on the reconstitution wafer and joined through an adhesive or epoxy to the encapsulation material. The lid may be casing extending the transducer opening in a direction orthogonal to the second main surface of the reconstitution wafer.

Figure 2F:
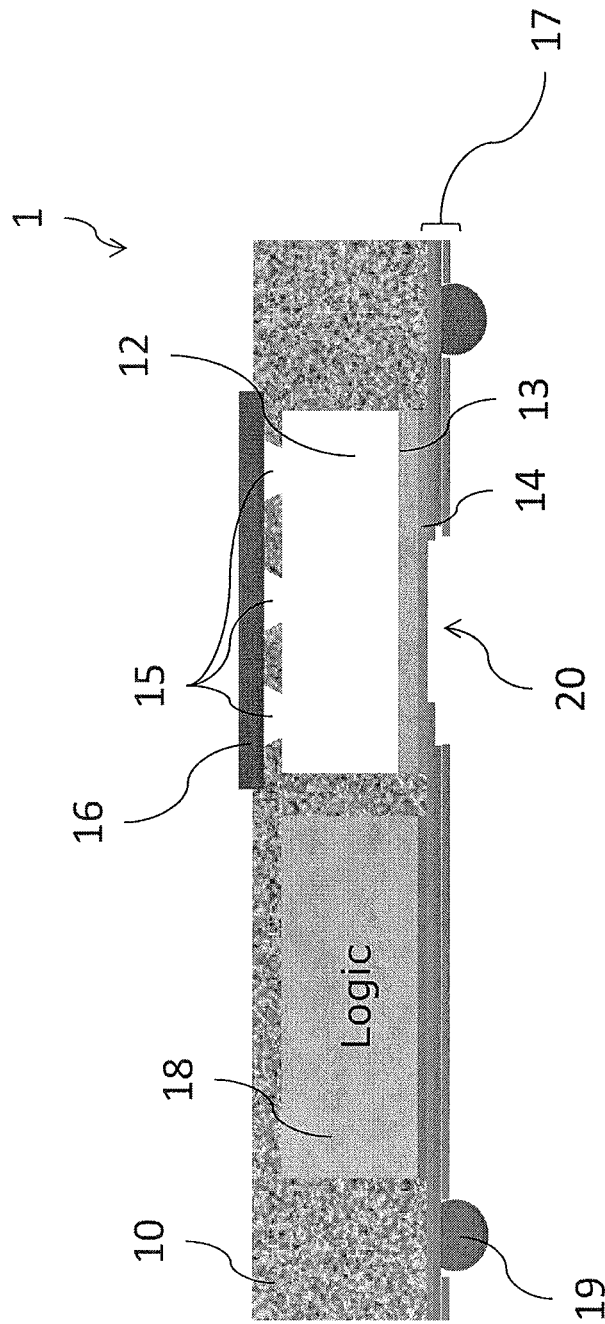

In an optional step 28 interconnects are applied to contact pads located in the RDL. For example, the interconnects may comprise solder balls, solder bumps, copper pillars or studs. Alternatively, the interconnects may comprise a wire, a land grid or a castellation. In step 29 the reconstitution wafer is singulated into individual integrated components applying a sawing process or laser singulating process. FIG. 2f shows the integrated component 1 comprising the lid 16 on the openings 15 and the MEMS opening 12. Solder balls 19 are disposed on the contact pads of the RDL 17.

The individual integrated component 1 may be placed on and bonded to a carrier such a printed circuit board (PCB), e.g. a flex board, a substrate or a ceramic board.

Figure 3A:
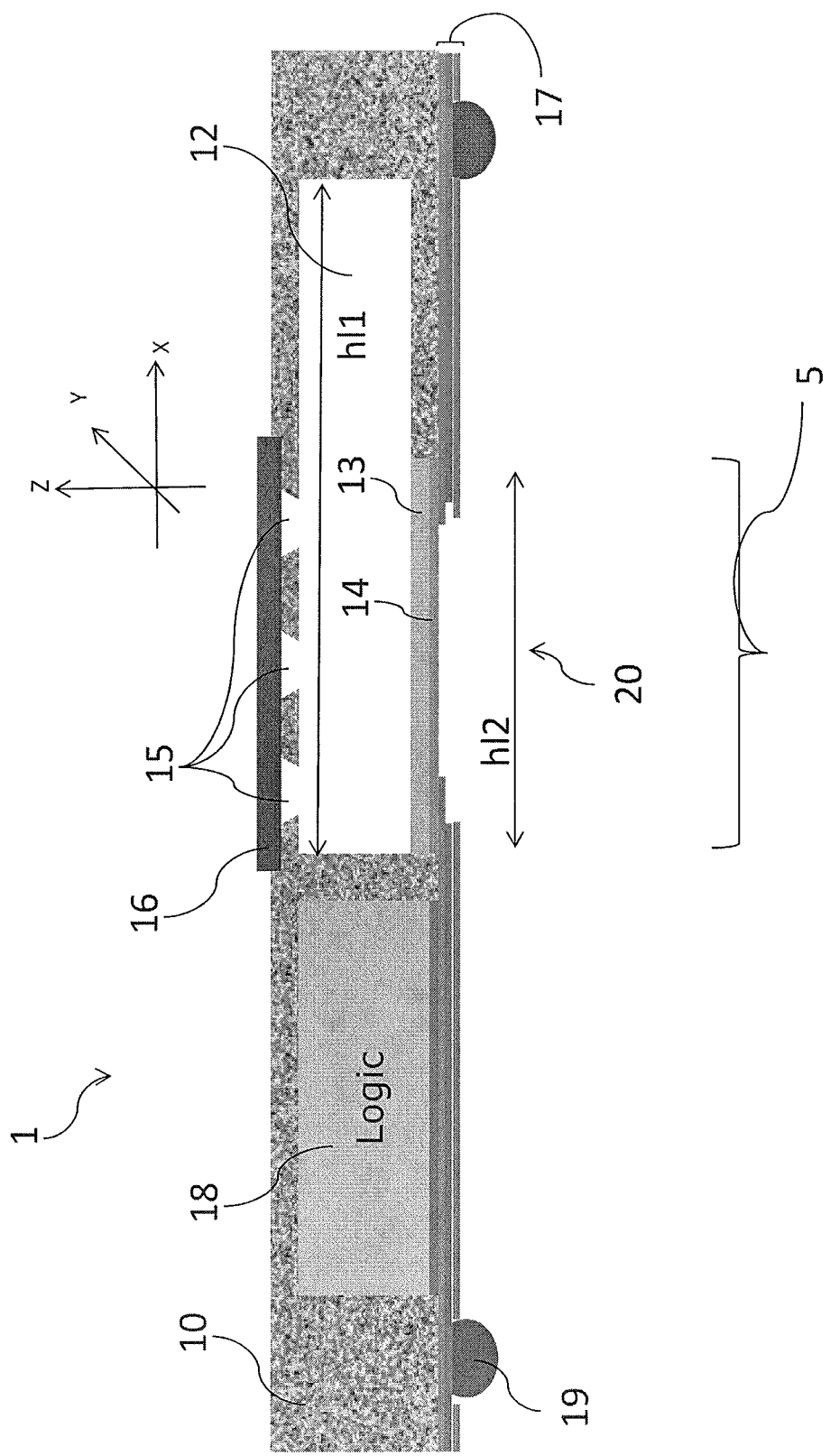
FIGS. 3a-3d show cross-sectional views of embodiments of integrated components.
Figure 3B:
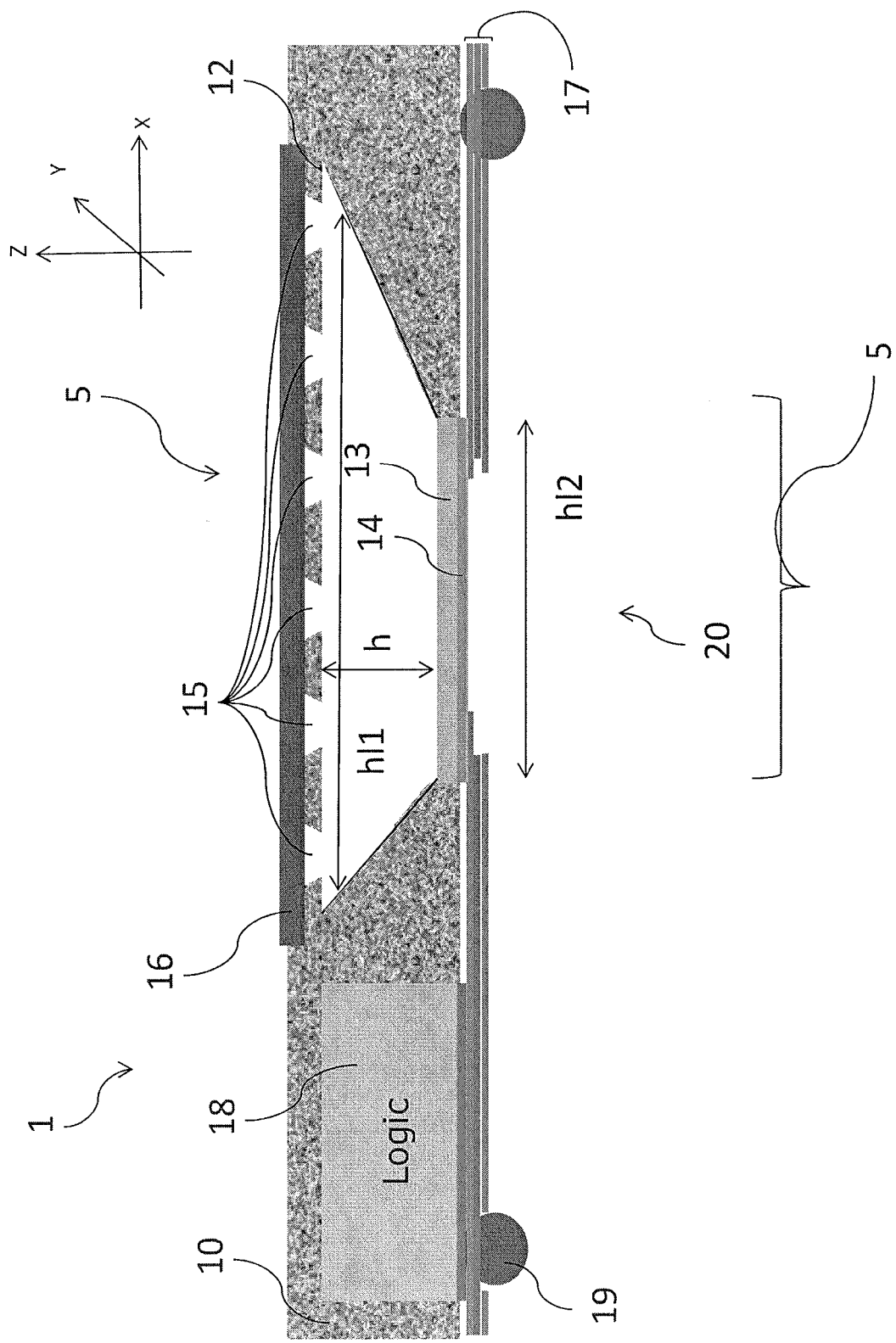
Figure 3C:
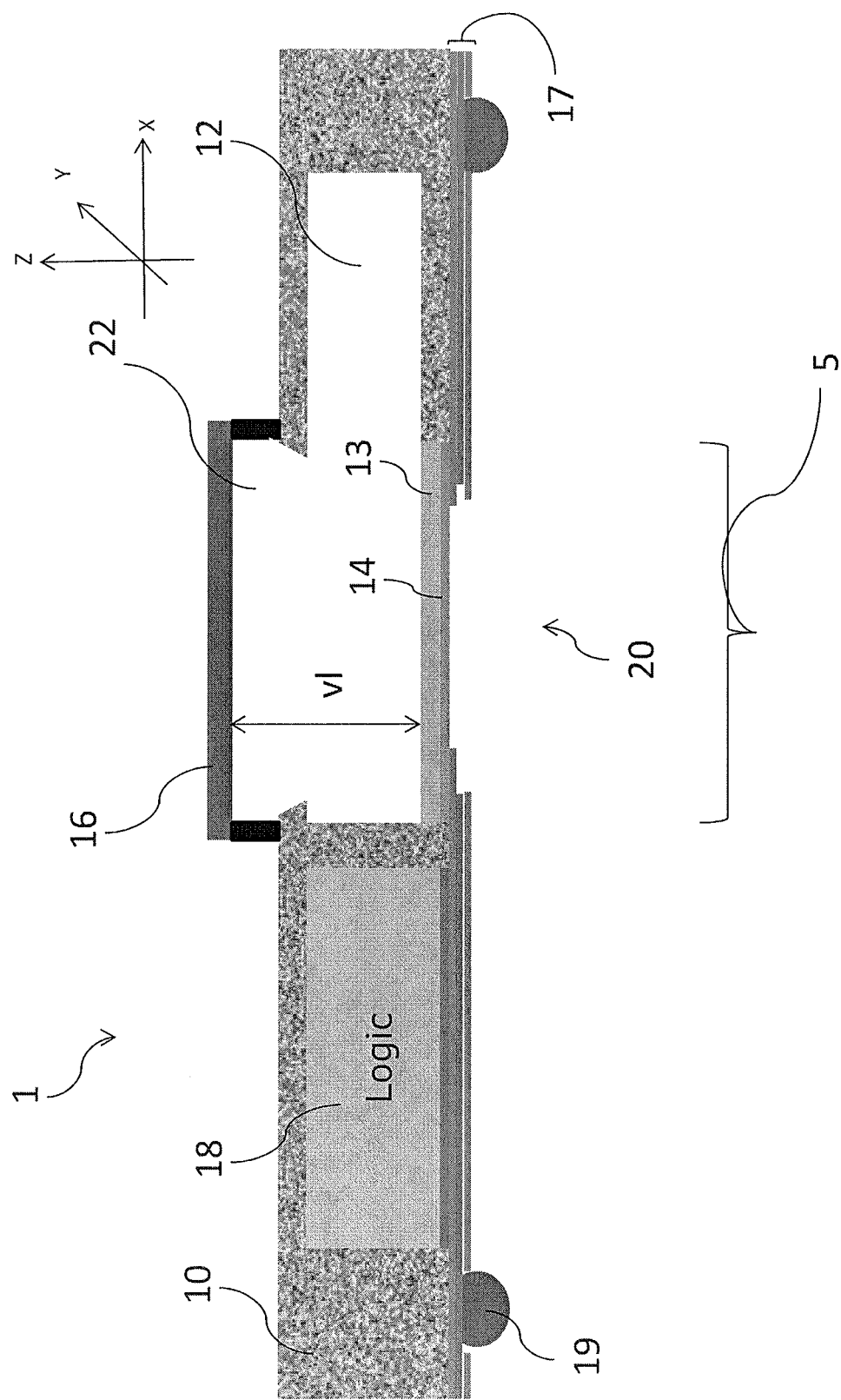

FIGS. 3a-3c show embodiments of the integrated sensor component with an increased MEMS opening (e.g., back volume). The performance of a MEMS microphone may be substantially affected by the size of the back volume. In one embodiment the back volume is extended into the fan out area of the encapsulation material thereby increasing the back volume without changing the dimensions of the MEMS microphone. Alternatively, the back volume is extended orthogonal to the membrane of the MEMS device by placing a body or casing on the second main surface of the reconstitution wafer. Moreover, the back volume is extended by increasing the back volume into the fan out area and by placing a casing or body on the MEMS opening. In one embodiment the membrane and the backplate may remain the same size as defined by the substrate of the MEMS microphone (when cut from the wafer) while the back volume is increased into the encapsulation material and/or orthogonal into a casing.

FIG. 3a shows an integrated sensor component 1 with an extended back volume (e.g., MEMS opening) 12. The horizontal length $hl_1$ of the back volume 12 is larger than the horizontal length $hl_2$ of the MEMS device 5 along the x-axis (or of the membrane 14 or the back plate 13). Similarly, the horizontal area (comprising of the length $hl_1$ and a length perpendicular to length $hl_1$, i.e. along the y-axis) of the back volume 12 is larger than the horizontal area (comprising of the length $hl_2$ and a length perpendicular to $hl_2$, i.e. along the y-axis) of the MEMS device 5 (or of the membrane 14 or the backplate 13). The MEMS opening 12 comprises substantially vertical sidewalls.

The embodiment of FIG. 3b shows an extended MEMS opening (e.g., back volume) 12 with tapered sidewalls. Similar to the embodiment of FIG. 3a the dimension of the MEMS opening 12 is defined by the encapsulation material and not by the substrate of the MEMS microphone 5. The horizontal length $hl_1$ of the MEMS opening 12 is larger than the horizontal length $hl_2$ of the MEMS device 5 (or of the membrane 14 or the back plate 13) for the entire height h of the MEMS opening 12 or of a substantial portion of the height h of the MEMS opening 12. Similarly, the horizontal area (comprising of the length $hl_1$ and a length perpendicular to length $hl_1$, i.e. along the y-axis) of the MEMS opening 12 is larger than the horizontal area (comprising of the length $hl_2$ and a length perpendicular to $hl_2$, i.e. along the y-axis) of the MEMS device 5 (or the membrane 14 or the backplate 13) for the entire height h of the MEMS opening 12 or of a substantial portion of the height h of the MEMS opening 12.

FIG. 3c shows an integrated sensor component 1 with an extended back volume (e.g., MEMS opening) 12. The vertical length vl of the back volume 12 is enlarged along the z-axis. The lid 16 may provide the additional length. For example, the lid 16 comprises a casing or body with an integrated opening 22. The casing is placed on the second main surface of the integrated component 1 encapsulating and extending the MEMS opening 12. The embodiment of FIG. 3c can be combined with the embodiments of FIG. 3a or 3b.

Figure 3D:
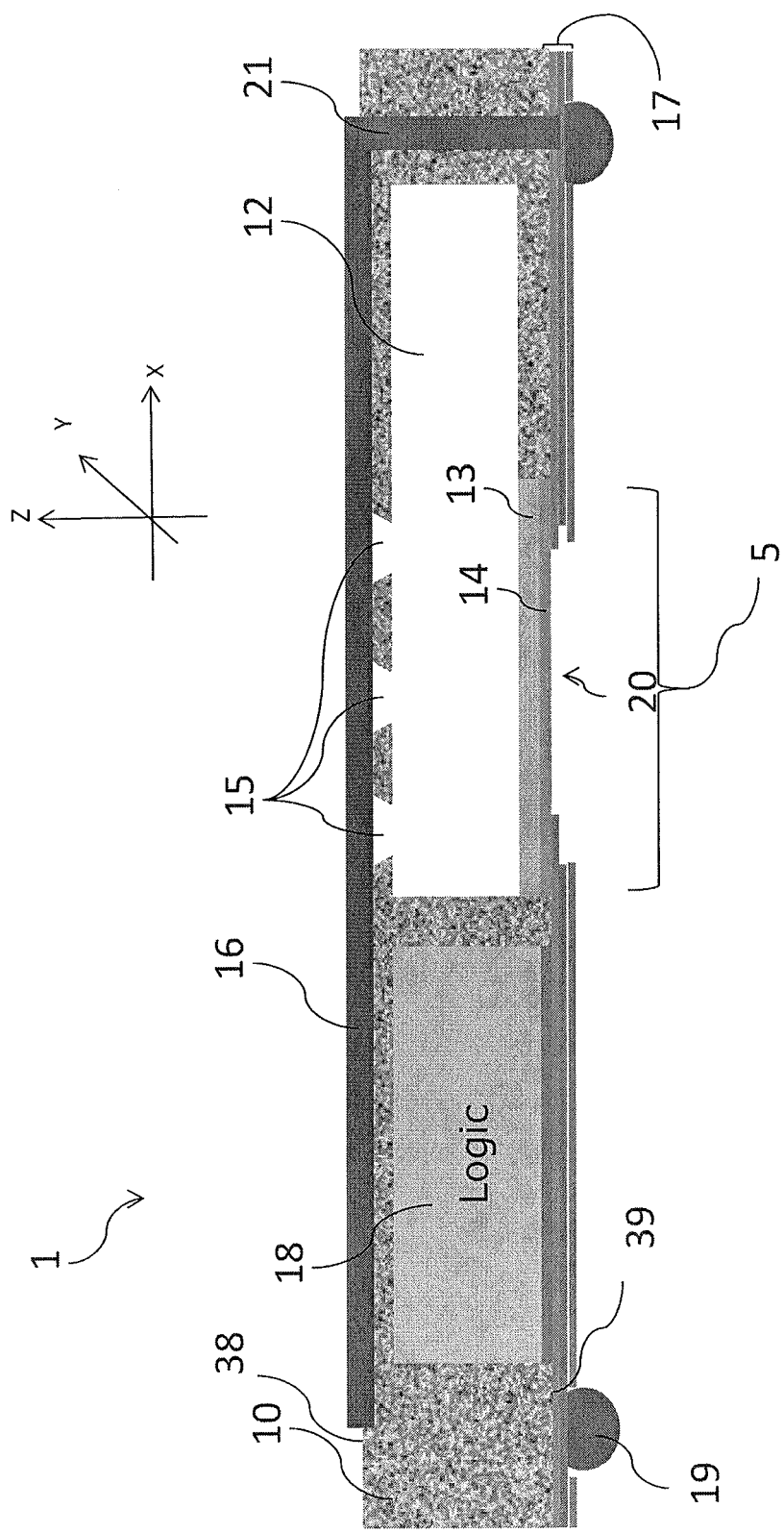

FIG. 3d shows an embodiment of an integrated component 1 comprising an extended MEMS opening 12 sealed with a conductive lid 16 on the second main surface 38 of the integrated component 1. The conductive lid 16 may be connected along the through via 21 to the first main surface 39 of the integrated component 1. In one embodiment the conductive lid 16 is electrically connected to a connection pad in the RDL 17. The conductive lid 16 may provide shielding against outside or internal interference such as electrical interference. In one embodiment the conductive lid 16 may be placed over the component 18 and the MEMS device 5. Alternatively, the conductive lid may be placed either over the component 18 or the MEMS device 5. The embodiment of FIG. 3d can be combined with the embodiments of FIG. 3b or 3c.

Figure 4A:
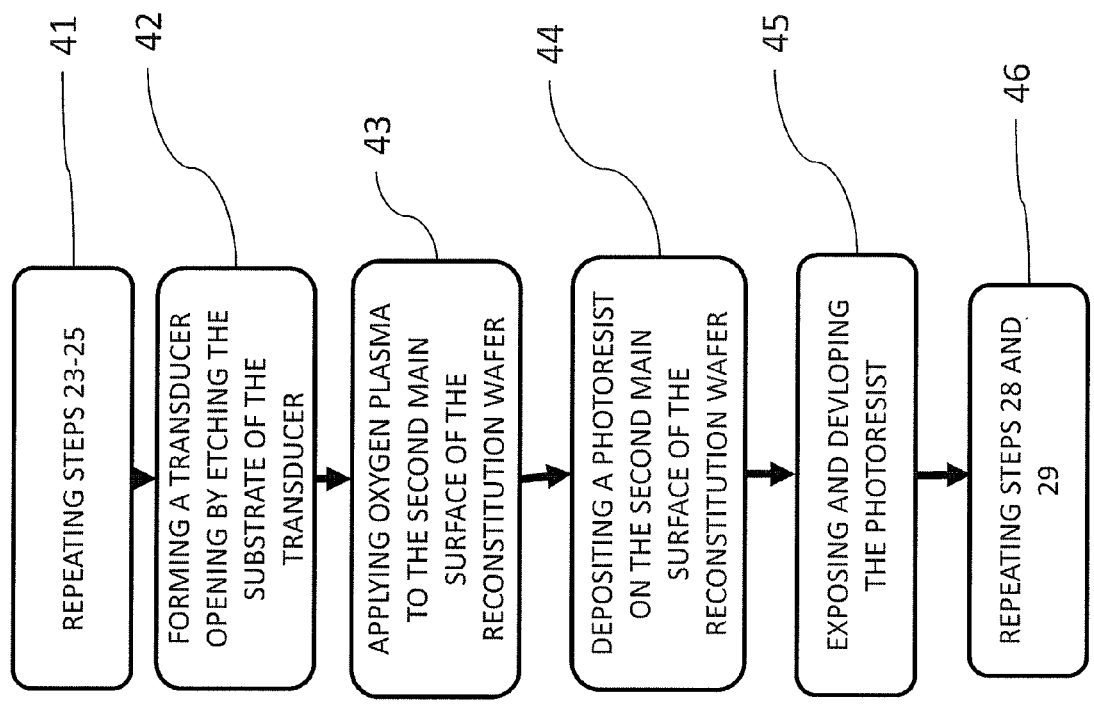
FIG. 4a shows a flow chart of an embodiment of a manufacturing process.

FIG. 4a shows a flow chart of an embodiment for manufacturing an integrated component. Step 41 repeats steps 23-25 of FIG. 2a. A reconstitution wafer is formed comprising a component and a transducer (e.g., a silicon MEMS microphone). An RDL is formed on the first main surface of the reconstitution wafer and the reconstitution wafer is opened from the second main surface forming etch holes or etch vias, e.g., piercing the encapsulation material of the reconstitution wafer over the transducer opening to be created. The etch holes or etch vias expose the substrate of the transducer. The etch holes or etch vias are formed by a 355 nm UV laser. The pitch between adjacent etch holes or etch vias may be about 30 μm to about 45 μm while the diameter of an individual hole is about 15 μm.

After step 41, the transducer is etched removing the substrate of the transducer through the vias and the holes. For example, the substrate of a MEMS microphone may be completely removed all the way down to the backplate. The encapsulation material may form the sidewalls of the transducer opening (e.g., back volume) (step 42). In step 43 an oxygen ($O_2$) plasma is applied to the pierced second main surface of the encapsulation material overlying the transducer opening. The oxygen plasma may make the pierced encapsulation material hydrophilic.

In the next step 44 a photoresist is disposed on the entire second main surface of the reconstitution wafer. The photoresist may be an epoxy photoresist. For example, the photoresist may comprise a permanent epoxy negative photoresist such as SU-8® of Microchem, or a permanent photoresist such as TMMR® of TOK. The photoresist may be spin-coated on the second main surface of the reconstitution wafer. The photoresist may comprise a thickness of about 20 μm to about 40 μm. Alternatively, the photoresist may comprise a thickness of about 30 μm or more. The photoresist is slowly dried. For example, the photoresist is dried by setting the temperature to about 60° C. and then increasing the temperature stepwise to about 100° C. Increasing the temperature from about 60° C. to about 100° C. may take about 15 min. The temperature is then held at about 100° C. for about another 15 min. The temperature may not be increased too fast because the photoresist may become liquid and may flow or drop into the transducer opening.

In step 45 the epoxy photoresist is exposed and developed at a temperature above about 200° C. In one embodiment the epoxy photoresist is exposed and developed at a temperature of about 220° C. The photoresist may be exposed only over the area of the MEMS opening or over the entire second main surface of the reconstitution wafer except for the singulating streets.

Alternatively, the photoresist may be a foil photoresist (e.g., TMMF/TOK). The foil photoresist may be laminated on the second main surface of the reconstitution wafer. The foil photoresist may comprise a thickness of about 50 μm or more. With such a thickness the foil photoresist may cover opening, holes or vias with a diameter of up to 200 μm.

Finally, in step 46 steps 28 and 29 of FIG. 2a are repeated. Interconnects may be applied to the connection pads of the RDL of the reconstitution wafer and the reconstitution wafer is singulated forming individual integrated components.

Figure 4B:
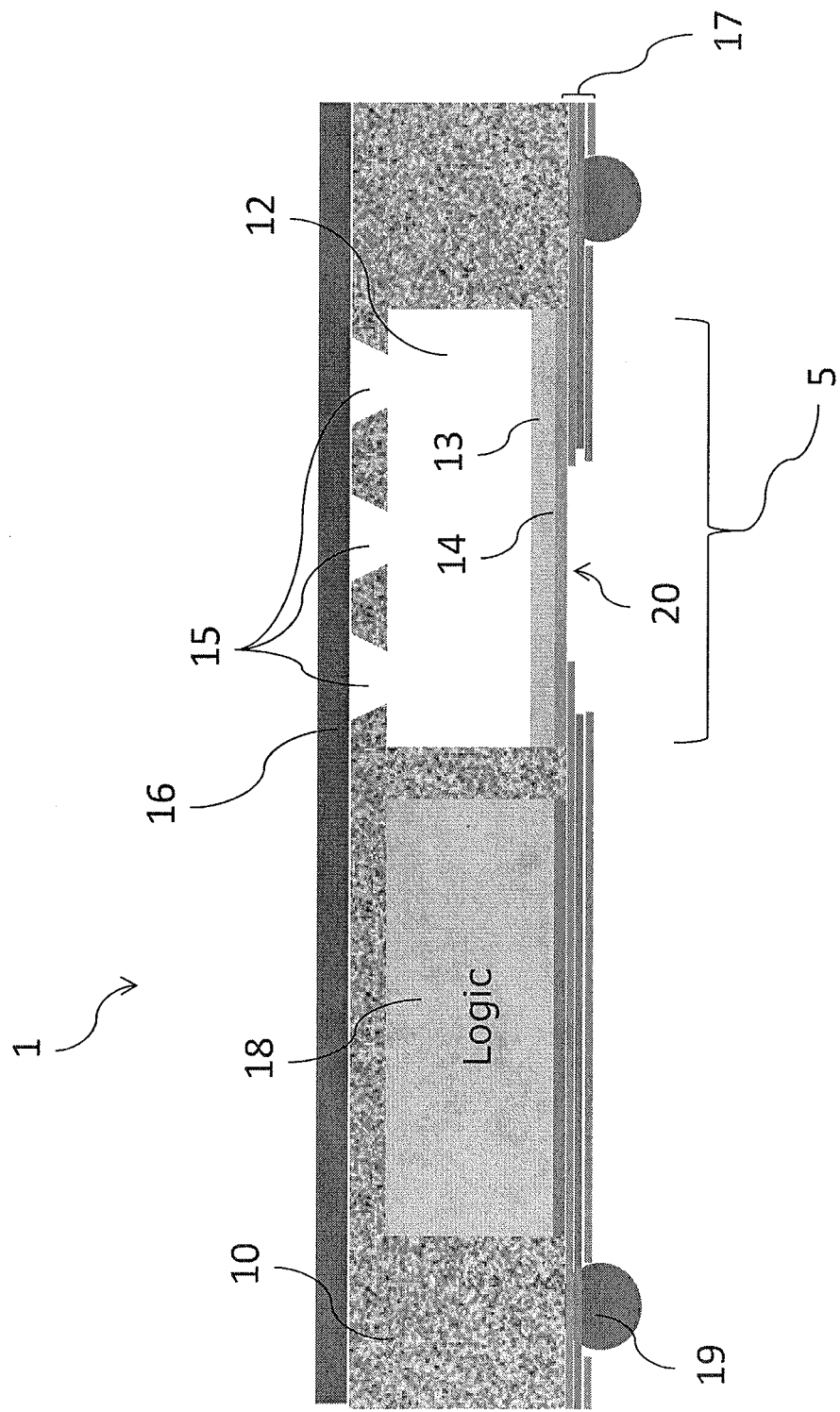
FIG. 4b shows a cross-sectional view of an embodiment of an integrated component.

FIG. 4b shows an embodiment of an integrated component 1 manufactured according to the process of FIG. 4a. The integrated component 1 comprises similar elements and materials as the integrated component of the other embodiments such as the embodiment of FIG. 1. However, the lid 16 of the integrated component 1 comprises an epoxy photoresist. Moreover, the integrated component 1 comprises a photoresist layer or lid disposed on the entire second main surface of the integrated component 1.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A packaged microphone comprising:
   a single unit encapsulation body providing a first main surface and a second main surface of the packaged microphone;
   a microphone disposed on the first main surface but not on the second main surface of the packaged microphone, the microphone comprising:
      a movable membrane disposed on a main surface of the microphone; and
      a backplate adjacent to the movable membrane;
   a back volume defined by the encapsulation body, wherein the encapsulation body has a direct interface with the back volume; and
   a lid disposed on the second main surface of the packaged microphone.

2. The packaged microphone according to claim 1, wherein the back volume comprises vertical sidewalls.

3. The packaged microphone according to claim 1, wherein the movable membrane and the backplate are configured to capacitively sense an acoustic signal.

4. The packaged microphone according to claim 1, wherein the encapsulation body is perforated at the second main surface of the package microphone.

5. The packaged microphone according to claim 1, wherein the lid comprises a photoresist material.

6. The packaged microphone according to claim 1, wherein the lid comprises a metal material.

7. A device comprising:
   a chip;
   a transducer disposed adjacent to the chip; and
   a single unit encapsulation body encapsulating the chip and the transducer, the encapsulation body defining a transducer opening next to the transducer, wherein the encapsulation body separates the chip from the transducer opening, and wherein the encapsulation body includes a direct interface with the transducer opening.

8. The device according to claim 7, wherein the transducer is configured to receive acoustic signals.

9. The device according to claim 7, further comprising a lid disposed on a top surface of the encapsulation body, the lid sealing the transducer opening.

10. The device according to claim 9, wherein the encapsulation body comprises a through-via connecting the top surface and a bottom surface of the encapsulation body, and wherein the lid is connected through the through-via to the bottom surface.

11. The device according to claim 10, wherein the lid is electrically connected through the through-via to a redistribution layer (RDL) disposed on the bottom surface of the encapsulation body.

12. The device according to claim 7, further comprising a redistribution layer (RDL) on a bottom surface of the encapsulation body, the RDL electrically connected to the transducer and the chip.

13. The device according to claim 7, wherein the transducer opening comprises vertical sidewalls.

14. A device comprising:
   a transducer; and
   a single unit encapsulation body encapsulating the transducer and a transducer opening adjacent to the transducer, wherein the encapsulation body defines the transducer opening, wherein the encapsulation body comprises a molding compound, and wherein the encapsulation body has a direct interface with the transducer opening.

15. The device according to claim 14, wherein the transducer is disposed on a first main surface of the encapsulation body, and wherein the transducer opening is disposed on a second main surface of the encapsulation body.

16. The device according to claim 14, wherein the transducer opening comprises vertical sidewalls.

17. The packaged microphone according to claim 1, wherein the back volume is encapsulated by the encapsulation body.

18. A device comprising:
   a chip;
   a transducer disposed adjacent to the chip; and
   an encapsulation material encapsulating the chip, the transducer and a transducer opening next to the transducer, wherein the transducer opening is defined by the encapsulation material, wherein the encapsulation material separates the chip from the transducer opening, wherein the transducer opening extends beyond an outline of the transducer wherein the encapsulation material is a monolithic encapsulation material, and wherein the encapsulation material is a molding compound.

19. The packaged microphone according to claim 1, wherein the back volume extends beyond an outline of the microphone, when viewed from the second main surface.

20. The device according to claim 7, wherein the transducer opening extends beyond an outline of the transducer.

21. The device according to claim 14, wherein the transducer opening extends beyond an outline of the transducer.

22. The packaged microphone according to claim 1, wherein the encapsulation body is a polyimide, an epoxy resin, a thermoplastic, a ceramic, a metal ceramic, or a metal plastic.

23. The device according to claim 7, wherein the encapsulation body is a polyimide, an epoxy resin, a thermoplastic, a ceramic, a metal ceramic, or a metal plastic.

* * * * *